United States Patent [19]

Faticanti

[11] Patent Number: 4,586,252

[45] Date of Patent: May 6, 1986

[54] TOOL FOR REMOVING SOLDERED COMPONENTS

[75] Inventor: Robert L. Faticanti, Dracut, Mass.

[73] Assignee: Avco Corporation, Wilmington, Mass.

[21] Appl. No.: 702,222

[22] Filed: Feb. 15, 1985

[51] Int. Cl.[4] .............................................. H05K 3/00
[52] U.S. Cl. ...................................... 29/762; 29/743; 228/56.1
[58] Field of Search ................... 29/762, 764, 743; 228/264, 56.1

[56] References Cited

U.S. PATENT DOCUMENTS

| | | | |
|---|---|---|---|
| 3,377,689 | 4/1968 | Kimmett | 29/764 |
| 3,731,866 | 5/1973 | Mason et al. | 29/762 X |
| 4,274,576 | 6/1981 | Shariff | 228/264 |
| 4,506,820 | 3/1985 | Brucker | 228/56.1 X |
| 4,528,746 | 7/1985 | Yoshimura | 228/264 X |

*Primary Examiner*—Carl E. Hall
*Attorney, Agent, or Firm*—Abraham Ogman; Robert J. McNair

[57] ABSTRACT

Apparatus is presented for removing a faulty component from a printed circuit board when attachment is by a plurality of input/output pins that extend outwardly from the component and protrude through holes in the printed circuit board where they are then soldered to printed circuitry. Removal is accomplished by clamping the printed circuit board in a fixture which includes a container of molten solder together with aligning and retaining elements which support the board over the surface of the molten solder so as to bring the protruding tips of the input/output pins into contact therewith. Above the clamped down printed circuit board a movable trolley is situated on a beam located parallel to and several inches above the printed circuit board. Extending downward from the trolley is a tubular metal bellows on the lower end of which is a rubber suction cup. The upper end of the bellows connects via flexible tubing to a vacuum pumping source. The trolley is moved along the beam until the suction cup can be made to contact the top surface of the faulty component. Application of a vacuum causes the tubular bellows to shrink in length creating a uniform pulling force on the component which draws it free from the printed circuit board as soon as the solder is melted from the downward extending pins.

4 Claims, 4 Drawing Figures

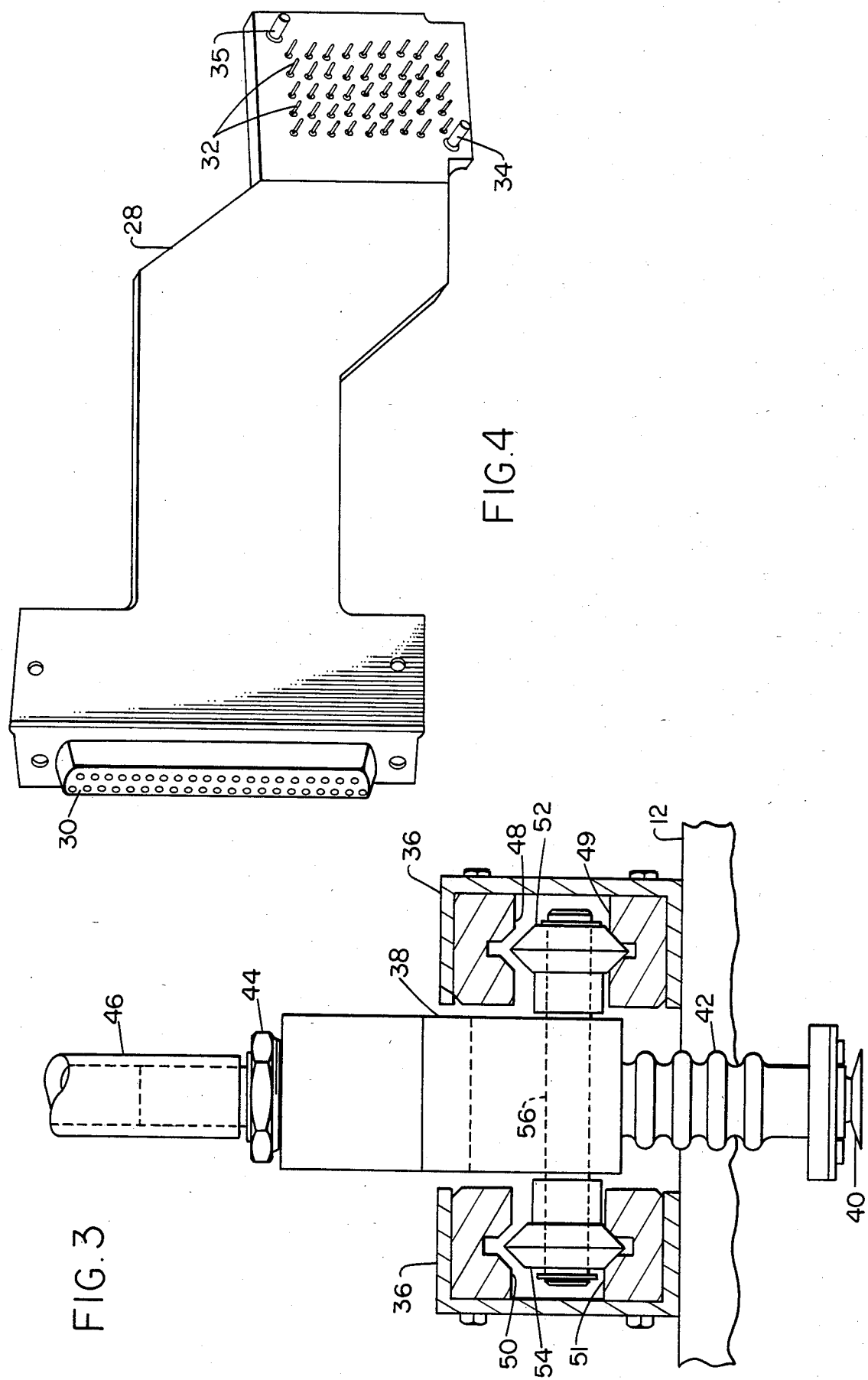

TOOL FOR REMOVING SOLDERED COMPONENTS

This application describes an invention made or partially made in the course of work under a U.S. Government contract, viz Air Force Contract No. F04704-79-C-0062. A confirmatory license has been granted to the U.S. Government to utilize the invention for government purposes.

BACKGROUND OF THE INVENTION

This invention relates to apparatus for removing a flex arm connector from printed circuit boards when one end of such components are soldered to the board.

Typically, a main interconnect board for an aerospace vehicle has more than a thousand connections soldered to a single printed circuit board. Thus, if a fault appears in one of the multiplicity of flex arm type input/output cables, it is economically feasible to seek ways to repair or replace the failed component rather than install an entire new main interconnect board assembly. Cost differential between repairing a flex arm and replacing an entire board assembly is something on the order of ten to one.

In the prior art, U.S. Pat. No. 4,485,958 to Lipkes discloses a tool for removing soldered IC packages from a printed circuit board. Lipkes teaches how to position a plurality of heat conducting rods which make contact with the individual pins of the IC package as they protrude from the underside of the board. The heat conducted by the rod ends to the pins softens the soldered connections and the spring loaded rods collectively press the IC package free from the board.

A second prior art approach for removing IC packages from printed circuit (PC) boards is to use a soldering iron to melt solder from around the pins where they contact the printed circuit conductors, then remove the molten solder with a solder sucker. This method works when removing chips having a relatively small number of pins, for example sixteen to twenty four. However, it has not proven to be a satisfactory means for removing flex arms from printed circuit boards wherein there are often more than a hundred pins extending from the attachment interface between the flex arm and the PC board.

BRIEF SUMMARY OF THE INVENTION

A primary object of the invention is to provide an improved tool for removing flex arms having a large number of input/output (I/O) pins soldered to a printed circuit board. In one embodiment of the invention this objective is achieved as follows. The main interconnect board utilizes a multiplicity of flex arms to provide input/output signals to control an aerospace vehicle. When a problem occurs in one of the flex arms, either in the cable connector end or the internal wiring within the flex arm, the faulty unit is replaced. Replacement is accomplished by attaching via peripheral clamps the main interconnect board to the same wave solder fixture used to assemble the board originally. Masking is used to protect all areas of the printed circuit board except that associated with the circuitry making connections with the pins of the faulty flex arm. The flowing solder contacts the tips of the pins that protrude through the board. Since all pins protrude outward an equal distance from the face of the flex arm, there is an even heat-up of pins allowing the melting of all contact points holding the pins to the printed circuit board. By choosing pin lengths which are slightly longer than absolutely needed the molten solder wave does not have to be placed so close to the printed circuit board that damage to the board results.

Above the clamped down main interconnect board, a fixture is positioned. This fixture comprises a movable trolley supported on a beam situated parallel to and several inches above the top surface of the board. Extending downward from the trolley is a tubular metal bellows on the lower end of which is a rubber suction cup. The trolley is moved along the beam until the suction cup is immediately above the top side of the area where the faulty flex arm attaches to the PC board. The suction cup is made to contact the flex arm surface and a vacuum source applied. Application of a vacuum causes the tubular bellows to shrink creating a uniform pulling force on the flex arm which draws it away from the PC board as soon as the solder is melted from the downward extending pins. The faulty flex arm can then be repaired or exchanged for a new one. The good one is then put back in place in the same manner as used in the original assembly procedure.

Use of a trolley rolling along a beam positioned directly over the centerline of the region where all of the flex arms attach to the PC board assures the pulling force can readily be applied to any flex arm that has a problem. Further, the applied pulling force will always be perpendicular to the clamped down board thus assuring that none of the pins get bent in the withdrawal operation. This minimizes the possibility of damage to the printed circuits.

BRIEF DESCRIPTION OF THE DRAWINGS

FIG. 3 is an enlarged cutaway end view of the beam and trolley mechanism.

FIG. 4 is an enlarged isometric view of a typical flex arm showing the multiplicity of pins which are soldered into the PC board.

DETAILED DESCRIPTION OF THE PREFERRED EMBODIMENT

Figure 1:
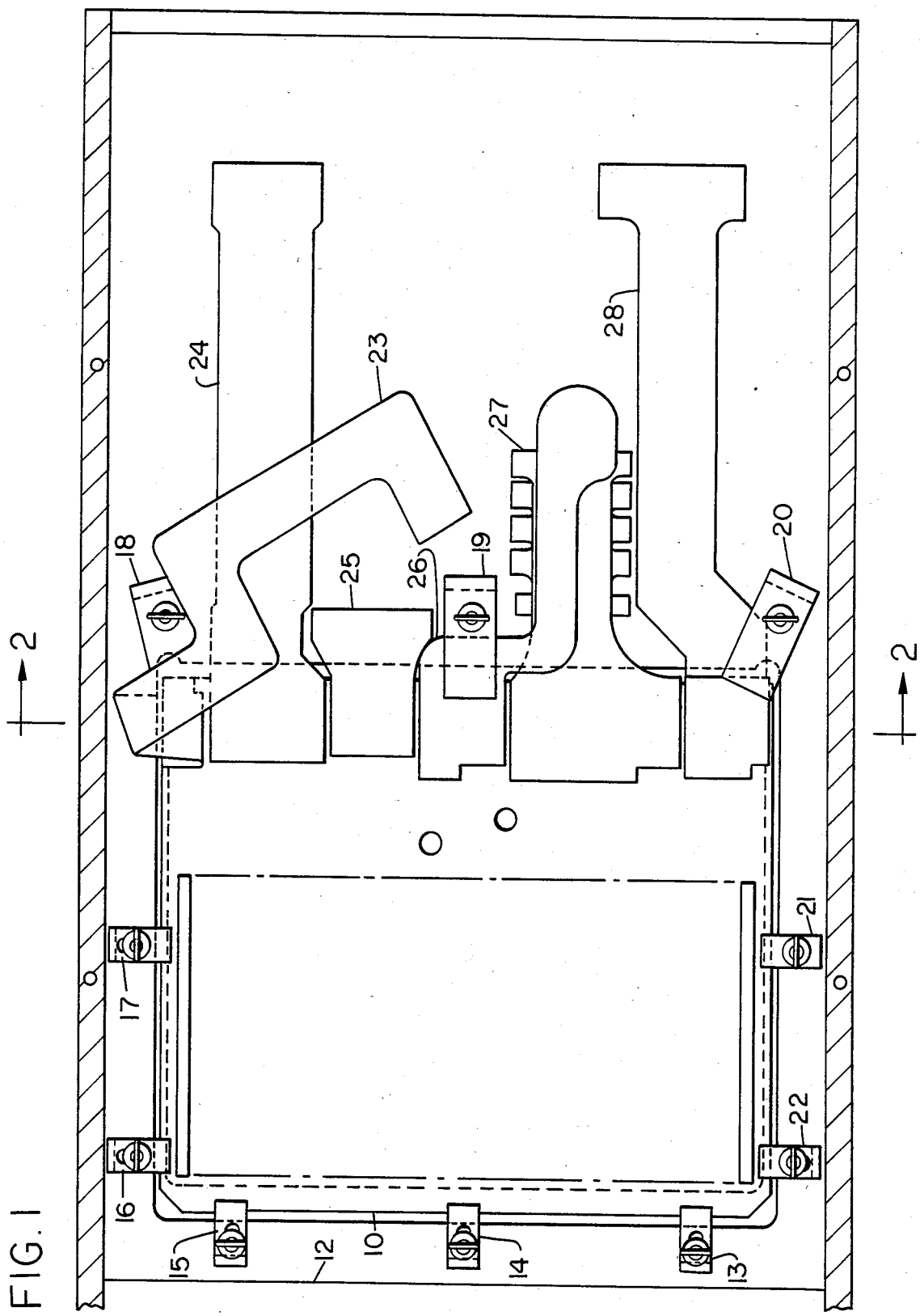
FIG. 1 is a top view of a main interconnect board clamped into position in the wave solder fixture.

FIG. 1 shows a main interconnect board 10 clamped in wave solder fixture 12. A total of ten spring loaded clamps 13, 14, . . . 22 are shown holding the main interconnect board 10 in place in fixture 12. Six flex arms 23, 24, . . . 28 are shown as being positioned along one edge of board 10. Each flex arm is typically made of stycast material and appears functionally as shown in FIG. 4 which corresponds to flex arm 28 of FIG. 1. In FIG. 4 a miniature 37-pin connector 30 is at the left hand or outer end of flex arm 28. The right hand or second end of flex arm 28 includes a 9×5 array of pins 32 which mate with and are soldered to the printed circuitry of main interconnect board 10. Guide pins 34 and 35 serve to index the second end of the flex arm during the assembly operation, thus preventing bending of pins 32.

The configuration of the other five flex arms of the unit reduced to practice is generally similar to that shown in FIG. 4. The outer end of each flex arm contains one or more connectors. These may be AN or MS types. The second end of each flex arm has an array of pins extending perpendicularly therefrom. In the assembly reduced to practice the number of pins ranged from twenty eight for flex arm 23 to one hundred seventy seven for flex arm 27.

Figure 2:
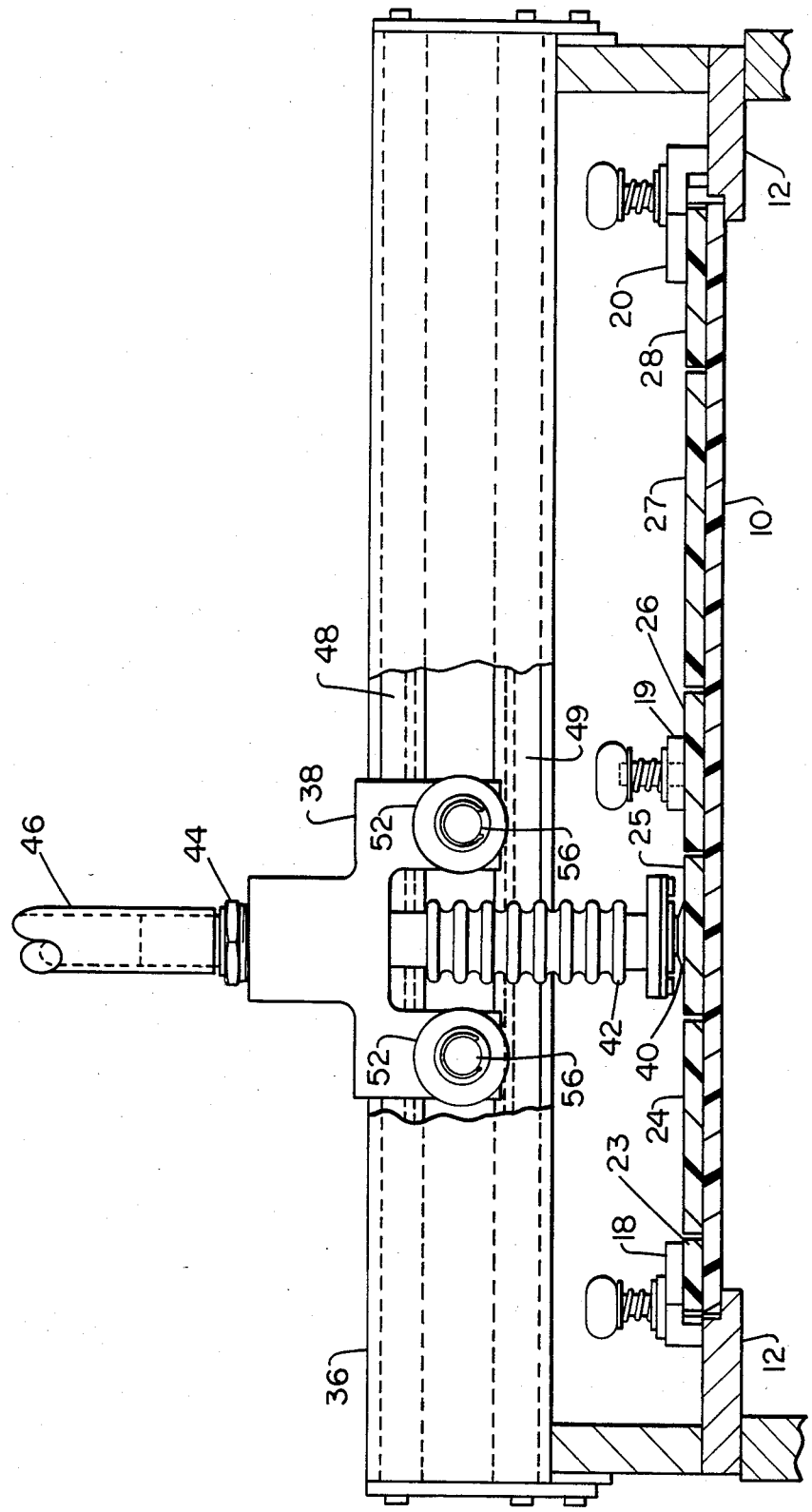
FIG. 2 is a side view partially cutaway of the beam and trolley used for positioning the suction cup over the faulty flex arm. The centerline of the beam is positioned over line 2—2 of FIG. 1.

Referring to FIG. 2 there is shown a side view partially cutaway of the beam 36 and the trolley 38 used for positioning suction cup 40 over the faulty flex arm which in this case is assumed to be flex arm 25. The center line of beam 36 is positioned over line 2—2 shown in FIG. 1. With beam 36 thus positioned, it will be possible to remove any one of the flex arms from the printed circuit board. Beam 36 is attached to the sidewalls of the wave solder fixture by bolts or other similar means.

For simplicity the cross section of the main interconnect board 10 is depicted in FIG. 2 without any of the wiring, printed circuits or other electrical connections. Similarly, none of the pins are shown as being present in the cross sectional view of the flex arms 23-28. This is done for simplicity and is not intended to in any way alter the actual configuration.

Trolley 38 has on its top surface a nipple 44 to which is attached a suction hose 46 that connects to a vacuum source. Extending downward from the body of trolley 38 is a metallic bellows 42 at the end of which is a rubber suction cup 40. FIG. 3 depicts an enlarged end view of beam 36 and trolley 38. In FIG. 3, it will be seen that beam 36 consists of two parts. A C-shaped flanged beam is on either side of trolley 38. The right hand C-shaped beam has attached thereto grooved rectangular rods 48 and 49. Similarly, left hand C-shaped beam has grooved upper and lower rods 50 and 51. Front and rear pairs of wheels 52 and 54 ride in the grooves of rods 49 and 51. The front and rear pairs of wheels 52 and 54 rotate on front and rear axles 56. C-ring clips hold the wheels on the axles.

With trolley 38 mounted on wheels as shown in FIGS. 2 and 3 it is possible to position suction cup 40 over the faulty flex arm. In the unit reduced to practice, positioning of the faulty flex arm was done manually. Positioning was accomplished by grasping the upper neck of trolley 38 and lifting it so that front and rear wheels 52 and 54 made contact with the grooves in rods 48 and 50. As shown in FIG. 3, there is a clearance of approximately 0.10 inches between wheels 52 and upper rods 48 and 50. This is sufficient clearance to allow movement of the trolley to a position above the faulty flex arm. With the lowering of the trolley to the point where it makes contact with the grooves in the rods 49 and 51 rubber suction cup 40 will make contact with and be slightly compressed against the top surface of the faulty flex arm. In FIG. 2 this positioning is against the top surface of faulty flex arm 25.

It is to be understood that the main interconnect board was masked off prior to insertion in wave solder fixture 12 such that only that area directly below flex arm 25 makes contact with the molten solder. As the flowing solder contacts the tips of the pins which protrude through the pointed circuit board, the solder holding the pins to the board will be melted. A vacuum source can then be applied via tube 46. Application of a vacuum will further seal the rubber suction cup 40 against the top surface of the flex arm. In the unit reduced to practice, a metal tubular bellows 42 was used. Application of a vacuum via tube 46 causes bellows 42 to shrink in length thereby creating a uniform pulling force on the top surface of the flex arm. The pulling force is uniform and serves to draw the flex arm away from the PC board as soon as solder is melted from the downward extending pins. The faulty flex arm 25 can then be repaired or exchanged for a new one. The repaired or exchanged arm can then be reinserted in the same manner as used in the original assembly procedure.

It will be understood that if it is necessary to remove one of the flex arms held down by a clamp, for example flex arm 28, clamp 20 is loosened, moved off to the edge of the PC board and reclamped. The trolley can then be moved along beam 36 until suction cup 40 is set down against the top surface of the flex arm. Removal of flex arm 28 of course requires the unmasking of the bottom surface of the PC board in the zone immediately below pins 32 (See FIG. 4).

While a manually positioned trolley and suction cup arrangement was reduced to practice, it will be readily understood that a more automatic system is feasible within the scope of this invention. For example, the suction cup can be raised and lowered into position by solenoid means. Additionally, the trolley can be positioned over the PC board in much the same way as an X-Y plotter is indexed by either analog or digital commands.

The size of the suction cup and the area it displaces on the top surface of the component to be lifted determines the pulling force applied. For example, if the area under the suction cup is half a square inch and a nominal vacuum is applied a pulling force of at least six pounds will be present before the suction cup tears free. In practice, a suction cup displacing a half of a square inch was found adequate to withdraw all sizes of flex arms.

Although but one embodiment of the invention has been illustrated and described in detail, it is to be expressly understood that the invention is not limited thereto. Various changes can be made in the arrangement of parts without depature from the spirit and scope of the invention as the same will now be understood by those skilled in the art.

I claim:

1. A tool for removing a faulty component from a printed circuit board when said component has a plurality of input/output pins that protrude through holes in said board and are soldered to printed circuits on the underside thereof, said tool comprising:

masking means for covering the bottom surface of said printed circuit board except for that area spanning the pins of the faulty component;

a fixture including a container for molten solder together with aligning and retaining means for supporting said printed circuit board over the surface of molten solder so as to bring the tips of said plurality of input/output pins into contact therewith where said pins protrude through said printed circuit board;

a beam supported at its ends and positioned parallel to and above the top surface of said printed circuit board, at least one position along said beam being directly over the area where said faulty component attaches to said printed circuit board;

a trolley movable along said beam to a position directly above said faulty component;

a vacuum pumping source; and vacuum lifting means depending from said trolley and in communication with said vacuum pumping source for contacting and raising said faulty component free from said printed circuit board when the soldered connections holding the plurality of input/output pins to said printed circuits melt, said vacuum lifting means including a tubular bellows having on its lower end a suction cup for making contact with said faulty component for accomplishing the lifting function, the cross sectional area of said suction cup being sized to control the magnitude of the component raising force.

2. The faulty component removal tool as defined in claim 1 wherein said rubber suction cup displaces 0.5 square in. of surface on said faulty component.

3. The invention as defined in claim 1 wherein the faulty component is a flex arm connector.

4. Apparatus for removing a faulty flex arm from a main interconnect board wherein said faulty flex arm is attached to said main interconnect board by a plurality of input/output pins forming an array that protrudes from one end of said flex arm, penetrates through said board making soldered connections with printed circuit elements on the bottom side of said board, said apparatus comprising:

a fixture including a container for molten solder together with aligning and retaining means for supporting said printed circuit board over the surface of molten solder so as to bring the tips of said plurality of input/output pins into contact therewith where said pins protrude through said main interconnect board;

a vacuum pumping source; and suction cup means positioned above and suspended over the top surface of the flex arm attachment with said main interconnect board, said suction cup means being in communication with said vacuum pumping source and serving to lift said flex arm from said board when melting of the soldered connections holding the plurality of input/output pins to said printed circuit elements is accomplished, the magnitude of the pulling force serving to lift said flex arm free from said interconnect board being proportional to the area displaced by the suction cup on the top surface of said flex arm.

* * * * *

UNITED STATES PATENT AND TRADEMARK OFFICE
CERTIFICATE OF CORRECTION

PATENT NO. : 4,586,252
DATED : May 6, 1986
INVENTOR(S) : Robert L. Faticanti

It is certified that error appears in the above-identified patent and that said Letters Patent are hereby corrected as shown below:

Column 4, line 37, change "depature" to --departure--.

Signed and Sealed this

Sixth Day of January, 1987

Attest:

DONALD J. QUIGG

*Attesting Officer*  *Commissioner of Patents and Trademarks*